(12) United States Patent
Li et al.

(10) Patent No.: US 11,374,065 B2
(45) Date of Patent: Jun. 28, 2022

(54) FLEXIBLE DISPLAY PANEL AND DISPLAY APPARATUS

(71) Applicant: BOE TECHNOLOGY GROUP CO., LTD., Beijing (CN)

(72) Inventors: Dong Li, Beijing (CN); Hongwei Tian, Beijing (CN); Chunyang Wang, Beijing (CN); Huijuan Zhang, Beijing (CN); Zheng Liu, Beijing (CN); Xiaolong Li, Beijing (CN); Meng Zhao, Beijing (CN); Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 83 days.

(21) Appl. No.: 16/965,920

(22) PCT Filed: Dec. 25, 2019

(86) PCT No.: PCT/CN2019/128259
§ 371 (c)(1),
(2) Date: Jul. 29, 2020

(87) PCT Pub. No.: WO2020/168821
PCT Pub. Date: Aug. 27, 2020

(65) Prior Publication Data
US 2021/0043701 A1     Feb. 11, 2021

(30) Foreign Application Priority Data
Feb. 22, 2019    (CN) .......................... 201910133977.3

(51) Int. Cl.
*G09G 5/00*        (2006.01)
*H01L 27/32*       (2006.01)
(Continued)

(52) U.S. Cl.
CPC ....... *H01L 27/3225* (2013.01); *G09G 3/3225* (2013.01); *H01L 27/3248* (2013.01);
(Continued)

(58) Field of Classification Search
CPC ............. H01L 27/3225; H01L 27/3248; H01L 27/3258; H01L 51/0097; H01L 51/5218;
(Continued)

(56) References Cited

U.S. PATENT DOCUMENTS 6,532,824 B1 * 3/2003 Ueno ....................... G01L 1/144
73/780
2016/0190216 A1 * 6/2016 Yang ................. G02F 1/136286
257/91
(Continued)

FOREIGN PATENT DOCUMENTS

CN    105741687 A    7/2016
CN    106247920 A    12/2016
(Continued)

OTHER PUBLICATIONS

First Office Action for related CN App No. 201910133977.3 dated May 21, 2020. English translation provided; 15 pages.

*Primary Examiner* — Jennifer T Nguyen
(74) *Attorney, Agent, or Firm* — Procopio, Cory, Hargreaves & Savitch LLP

(57) ABSTRACT

A flexible display panel has a display area, a peripheral area surrounding the display area, and a bending area having at least one overlapping area with the peripheral area. The flexible display panel includes a plurality of conductive layers disposed in the display area, and at least one interdigital capacitor disposed in the at least one overlapping area. One of the at least one interdigital capacitor is disposed in a same layer with a same material as one of the plurality of conductive layers.

17 Claims, 6 Drawing Sheets

(51) Int. Cl.
  *G09G 3/3225* (2016.01)
  *H01L 51/00* (2006.01)
  *H01L 51/52* (2006.01)

(52) U.S. Cl.
  CPC . *H01L 27/3258* (2013.01); *G09G 2300/0426* (2013.01); *G09G 2380/02* (2013.01); *H01L 51/0097* (2013.01); *H01L 51/5218* (2013.01); *H01L 2251/5315* (2013.01); *H01L 2251/5338* (2013.01)

(58) Field of Classification Search
  CPC .... H01L 2251/5315; H01L 2251/5338; G09G 3/3225; G09G 2300/0426; G09G 2380/02
  USPC .......................................................... 345/214
  See application file for complete search history.

(56) References Cited

U.S. PATENT DOCUMENTS

| | | | |
|---|---|---|---|
| 2018/0040678 A1* | 2/2018 | Zhai | ......................... G06F 3/045 |
| 2018/0114491 A1 | 4/2018 | Tokuda | |
| 2019/0074332 A1* | 3/2019 | Kim | ................... H01L 51/0097 |
| 2021/0280649 A1* | 9/2021 | Chen | ........................ H01L 51/56 |

FOREIGN PATENT DOCUMENTS

| | | | |
|---|---|---|---|
| CN | 109786430 A | 5/2019 | |
| KR | 20170025870 A | 3/2017 | |

\* cited by examiner

FLEXIBLE DISPLAY PANEL AND DISPLAY APPARATUS

CROSS-REFERENCE TO RELATED APPLICATIONS

This application is a national phase entry under 35 USC 371 of International Patent Application No. PCT/CN2019/128259 filed on Dec. 25, 2019, which claims priority to Chinese Patent Application No. 201910133977.3, filed on Feb. 22, 2019, which are incorporated herein by reference in their entirety.

TECHNICAL FIELD

The present disclosure relates to the field of display technologies, and in particular, to a flexible display panel and a display apparatus.

BACKGROUND

With the development of the flexible organic light-emitting diode (OLED) technology, more types of flexible display apparatuses appear, such as foldable mobile phones, screen-like televisions, or two-in-one products of mobile phones and computers.

SUMMARY

In an aspect, a flexible display panel is provided. The flexible display panel has a display area, a peripheral area surrounding the display area, and a bending area having at least one overlapping area with the peripheral area. The flexible display panel includes a plurality of conductive layers disposed in the display area and at least one interdigital capacitor disposed in the at least one overlapping area. One of the at least one interdigital capacitor is disposed in a same layer with a same material as one of the plurality of conductive layers.

In some embodiments, each interdigital capacitor includes two interdigital capacitor plates arranged crosswise. Each interdigital capacitor plate includes a plurality of interdigital fingers, extending directions of the plurality of interdigital fingers being parallel to or substantially parallel to an extending direction of a bending axis of the bending area; and a bending sensing portion connected to the plurality of interdigital fingers, an extending direction of the bending sensing portion crossing the extending direction of the bending axis of the bending area.

In some embodiments, the extending direction of the bending sensing portion is perpendicular to or substantially perpendicular to the extending direction of the bending axis of the bending area.

In some embodiments, the at least one interdigital capacitor includes a plurality of interdigital capacitors, a first interdigital capacitor in the plurality of interdigital capacitors is disposed in a same layer with a same material as one of at least two conductive layers of the plurality of conductive layers, and a second interdigital capacitor in the plurality of interdigital capacitors is disposed in a same layer with a same material as another one of the at least two conductive layers. The flexible display panel further includes a first insulating layer disposed between every two adjacent conductive layers in the at least two conductive layers. The first insulating layer is provided with a plurality of first through holes therein, one interdigital capacitor plate of the first interdigital capacitor is electrically connected to one interdigital capacitor plate of the second interdigital capacitor by one of the plurality of first through holes in the first insulating layer between layers where the first and second interdigital capacitors are located, and the other interdigital capacitor plate of the first interdigital capacitor is electrically connected to the other interdigital capacitor plate of the second interdigital capacitor by another one of the plurality of first through holes in the first insulating layer between the layers where the first and second interdigital capacitors are located.

In some embodiments, the at least one interdigital capacitor includes a plurality of interdigital capacitors, one of the plurality of interdigital capacitors is disposed in a same layer with a same material as one of at least two conductive layers of the plurality of conductive layers, and another one of the plurality of interdigital capacitors is disposed in a same layer with a same material as another one of the at least two conductive layers. At least two of the plurality of interdigital capacitors are located in a same one of the at least one overlapping area.

In some embodiments, the at least one overlapping area includes a plurality of overlapping areas, the at least one interdigital capacitor includes a plurality of interdigital capacitors. The plurality of interdigital capacitors are disposed in a same layer with a same material as one of the plurality of conductive layers. The plurality of interdigital capacitors are located in different overlapping areas of the plurality of overlapping areas.

In some embodiments, the flexible display panel further includes a second insulating layer disposed under the interdigital capacitor. The second insulating layer includes a plurality of strip-shaped protrusions arranged at intervals and in parallel, and extending directions of the plurality of strip-shaped protrusions are parallel to or substantially parallel to the extending direction of the bending axis of the bending area. The plurality of interdigital fingers in the interdigital capacitor plates of the interdigital capacitor are conductive films covering the plurality of strip-shaped protrusions.

In some embodiments, a thickness of each strip-shaped protrusion is within a range from 1 µm to 3 µm, inclusive.

In some embodiments, a space between every two adjacent interdigital fingers in the interdigital capacitor is within a range from 3 µm to 5 µm, inclusive. A dimension of each interdigital finger in a direction perpendicular to an extending direction of the interdigital finger is within a range from 3 µm to 5 µm, inclusive.

In some embodiments, the flexible display panel further includes a third insulating layer covering the interdigital capacitor. A portion of the third insulating layer fills between every two adjacent interdigital fingers of the interdigital capacitor to form an insulating medium in the interdigital capacitor.

In some embodiments, the insulating medium includes a silicon-based organic material.

In some embodiments, the bending area is located in a middle of the flexible display panel.

In some embodiments, the flexible display panel further includes a base; a plurality of driving circuits disposed above the base and located in the display area, each driving circuit including a driving thin film transistor and a storage capacitor, the driving thin film transistor including a gate, a source and a drain, the storage capacitor including a first electrode and a second electrode; and a plurality of light-emitting devices disposed on a side of the plurality of driving circuits facing away from the base and located in the display area, each light-emitting device of the plurality of light-emitting devices including an anode, the light-emitting device being configured to emit light when driven by a corresponding one of the plurality of driving circuits. The plurality of conductive layers include at least two of: an anode layer where the anode is located, a source-drain layer where the source and the drain are located, a gate layer where the gate is located, a first electrode layer where the first electrode is located, and a second electrode layer where the second electrode is located.

In some embodiments, the first electrode layer and the gate layer are in a same layer, and the second electrode layer is disposed between the gate layer and the source-drain layer. The flexible display panel further includes a fourth insulating layer disposed between the gate layer and the second electrode layer, and a fifth insulating layer disposed between the second electrode layer and the source-drain layer. The fifth insulating layer is provided with a second through hole therein, and the second electrode in the second electrode layer is electrically connected to the drain in the source-drain layer by the second through hole in the fifth insulating layer.

In some embodiments, the first electrode layer is in a layer as one of: the gate layer, the source-drain layer, and the anode layer; and the second electrode layer is in a same layer as another one of: the gate layer, the source-drain layer, and the anode layer.

In some embodiments, the flexible display panel further includes an auxiliary electrode layer disposed between the source-drain layer and the anode layer. The auxiliary electrode layer is electrically connected to the anode layer, and to the drain in the source-drain layer. The plurality of conductive layers further include the auxiliary electrode layer.

In some embodiments, the light-emitting device is a top-emitting light-emitting device, and the anode of the light-emitting device is capable of reflect light.

In another aspect, a display apparatus is provided. The display apparatus includes the flexible display panel as described in some embodiments above, a first voltage terminal and a second voltage terminal.

Each interdigital capacitor in the flexible display panel includes two interdigital capacitor plates electrically connected to the first voltage terminal and the second voltage terminal, respectively.

In some embodiments, the display apparatus further includes a detection circuit electrically connected to the at least one interdigital capacitor. The detection circuit is configured to determine a bending state of the flexible display panel according to a change value of a capacitance of the interdigital capacitor.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products and an actual process of a method that the embodiments of the present disclosure relate to.

DETAILED DESCRIPTION

Technical solutions in some embodiments of the present disclosure will be described clearly and completely with reference to accompanying drawings. Obviously, the described embodiments are merely some but not all of the embodiments of the present disclosure. All other embodiments obtained on a basis of embodiments of the present disclosure by a person of ordinary skill in the art shall be included in the protection scope of the present disclosure.

Unless the context requires otherwise, throughout the description and claims, the term "comprise/include" and other forms thereof such as the third-person singular form "comprises/includes" and the present participle form "comprising/including" are construed as an open and inclusive meaning, i.e., "included, but not limited to". In the description of the specification, terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are only used for descriptive purposes and are not to be construed as indicating or implying the relative importance or implicitly indicating the number of indicated technical features below. Thus, features defined by the terms "first" and "second" may explicitly or implicitly include one or more of the features.

In the description of the embodiments of the present disclosure, the term "a/the plurality of" means two or more unless otherwise specified.

At present, for a foldable display screen or bendable display screen, a bending sensor is usually attached to a screen of the display screen, so as to sense a bending state of the display screen by using of the bending sensor. However, attaching the bending sensor directly to the screen of the display screen will greatly increase a thickness of the display screen, which is not conducive to the bending of the screen, and also increases a manufacturing process and the cost of the display screen.

Figure 1:
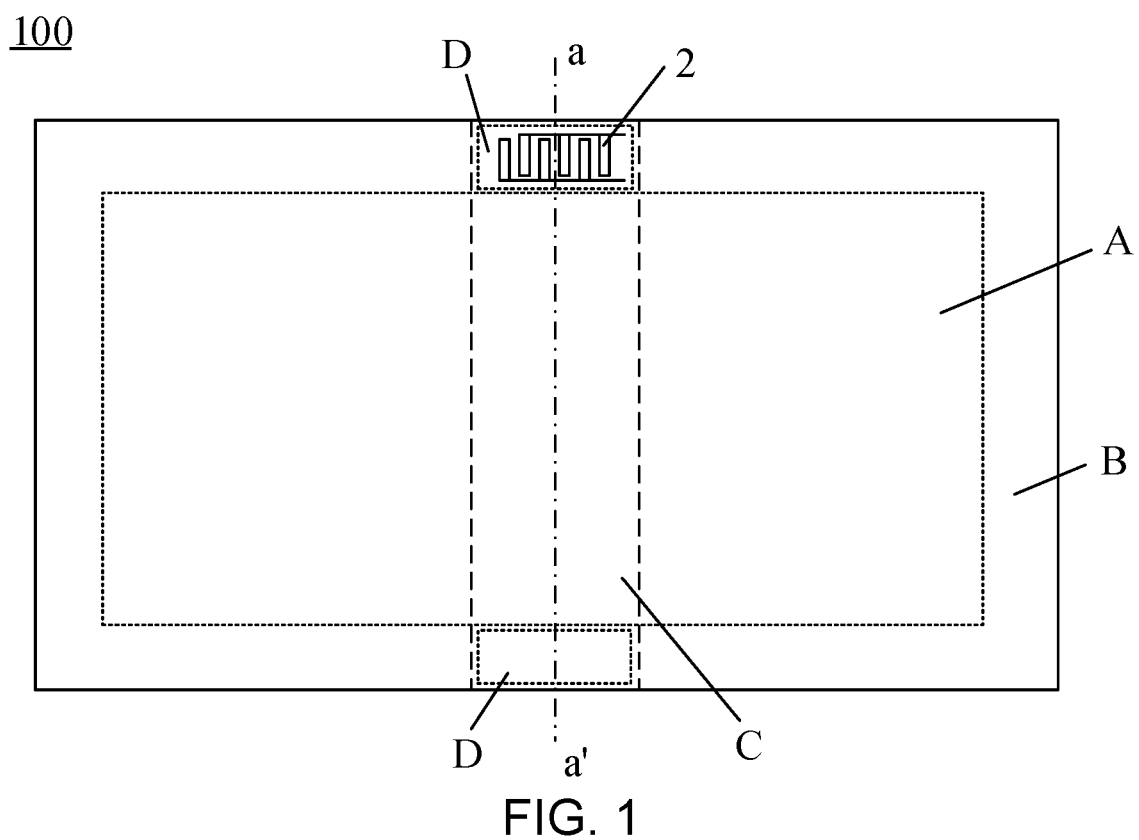
FIG. 1 is a top view of a flexible display panel, in accordance with some embodiments of the present disclosure.

On this basis, some embodiments of the present disclosure provide a flexible display panel 100. As shown in FIG. 1, the flexible display panel 100 has a display area (i.e., active area, abbreviated as AA) A and a peripheral area B surrounding the display area A. The flexible display panel further has a bending area C. As shown in FIG. 1, the bending area C may be located in a middle of the flexible display panel 100.

In some embodiments, as shown in FIGS. 1, 4, 5, 7, and 8, the flexible display panel 100 includes a plurality of conductive layers 1 disposed in the display area A and at least one interdigital capacitor 2 disposed in overlapping area(s) D of the bending area C and the peripheral area B. The at least one interdigital capacitor 2 is disposed in the same layer with the same material as at least one conductive layer 1 of the plurality of conductive layers 1. In the at least one interdigital capacitor 2, a capacitance of each interdigital capacitor 2 can change as a bending state of the flexible display panel 100 changes.

In the specification, the expression "disposed in a/the same layer with a/the same material" refers that, a film is formed for forming specific patterns by using of a film-forming process, and then a single patterning process is performed on the film to form a layer structure by using of a mask. Depending on different specific patterns, the single patterning process may include a plurality of exposure, development or etching processes, the specific patterns formed in the layer structure may be continuous or discontinuous, and these specific patterns may also be at different heights or have different thicknesses. In this way, a number of film manufacturing processes is not increased by setting patterns of a plurality of elements or components (such as a source and a drain) in the same layer, which is conducive to reducing a thickness of the flexible display panel 100 and simplifying the manufacturing process of the flexible display panel 100. The expression "disposed in a/the same layer with a/the same material" mentioned below has the same meaning as the above-mentioned expression "disposed in a/the same layer with a/the same material".

A type of the flexible display panel 100 described above is diverse. For example, the flexible display panel 100 is a top light-emitting display panel. For another example, the flexible display panel 100 is a bottom light-emitting display panel.

For example, the flexible display panel 100 is the top light-emitting display panel, and a structure of the flexible display panel 100 is schematically described below.

As shown in FIGS. 3, 4, 5, 7 and 8, the flexible display panel 100 further includes a base 3, a plurality of driving circuits 4 disposed above the base 3 and located in the display area A, and a plurality of light-emitting devices 5 disposed on a side of the plurality of driving circuits 4 away from the base 3 and located in the display area A. Here, each light-emitting device 5 is configured to emit light when driven by a driving circuit 4. The light-emitting device 5 includes an anode 501.

In some examples, the light-emitting device 5 is a top-emitting light-emitting device, and the anode 501 of the light-emitting device 5 can reflect light. For example, the anode 501 may have a stacking structure of a transparent electrode layer, a reflective metal layer, and another transparent electrode layer. A material of the transparent electrode layer is, for example, indium tin oxide (ITO), and a material of the reflective metal layer is, for example, elemental silver.

In some embodiments, each driving circuit 4 of the plurality of driving circuits 4 includes a driving thin film transistor 401 and a storage capacitor 402. The storage capacitor 402 includes a first electrode 4021 and a second electrode 4022.

In some examples, the driving thin film transistor 401 is a thin film transistor with a top gate structure as shown in FIG. 4, 5, 7 or 8. The driving thin film transistor 401 includes a gate 4011 disposed on a side of the base 3, a source 4012 and a drain 4013 both disposed on a side of the gate 4011 facing away from the base 3. The source 4012 and the drain 4013 are disposed in the same layer with the same material.

In some examples, the plurality of conductive layers 1 disposed in the display area A include at least two of: an anode layer 101 where the anode 501 is located, a gate layer 102 where the gate 4011 is located, a source-drain layer 103 where the source 4012 and drain 4013 are located, a first electrode layer 104 where the first electrode 4021 is located, and a second electrode layer 105 where the second electrode 4022 is located.

In the specification, the expression "a layer B where A is located" means that a pattern corresponding to the layer B includes a pattern corresponding to A. If the pattern corresponding to the layer B further includes a pattern corresponding to C, the pattern corresponding to A and the pattern corresponding to C are disposed in the same layer with the same material. The expression "disposed in the same layer with the same material" here has the same meaning as the expression "disposed in a/the same layer with a/the same material" above. In the specification, the pattern corresponding to the layer B may include a plurality of patterns each corresponding to A.

In some examples, as shown in FIG. 1, since the peripheral area B surrounds the display area A, there are two overlapping areas D between the bending area C and the peripheral area B. In some examples, the at least one interdigital capacitor 2 may be all disposed in any one of the two overlapping areas D. In some other examples, the at least one interdigital capacitor 2 includes a plurality of interdigital capacitors 2, the plurality of interdigital capacitors 2 may be disposed in the two overlapping areas D, or the interdigital capacitors 2 may be all disposed in any one of the two overlapping areas D.

The at least one interdigital capacitor 2 is disposed in the same layer with the same material as at least one conductive layer 1 of the plurality of conductive layers 1. That is, in a case where the at least one interdigital capacitor 2 includes one interdigital capacitor 2, the interdigital capacitor 2 may be disposed in the same layer with the same material as any one of: the anode layer 101, the source-drain layer 103, the gate layer 102, the first electrode layer 104 and the second electrode layer 105. In a case where the at least one interdigital capacitor 2 includes a plurality of interdigital capacitors 2, the plurality of interdigital capacitors 2 may be all disposed in the same layer with the same material as any one of: the anode layer 101, the source-drain layer 103, the gate layer 102, the first electrode layer 104 and the second electrode layer 105, or the plurality of interdigital capacitors 2 may be disposed in the same layers with the same materials as at least two of: the anode layer 101, the source-drain layer 103, the gate layer 102, the first electrode layer 104 and the second electrode layer 105. Here, the expression "same layers with the same materials" means that, one interdigital capacitor is disposed in the same layer with the same material as one conductive layer, and another interdigital capacitor is disposed in the same layer with the same material as another conductive layer.

Figure 4:
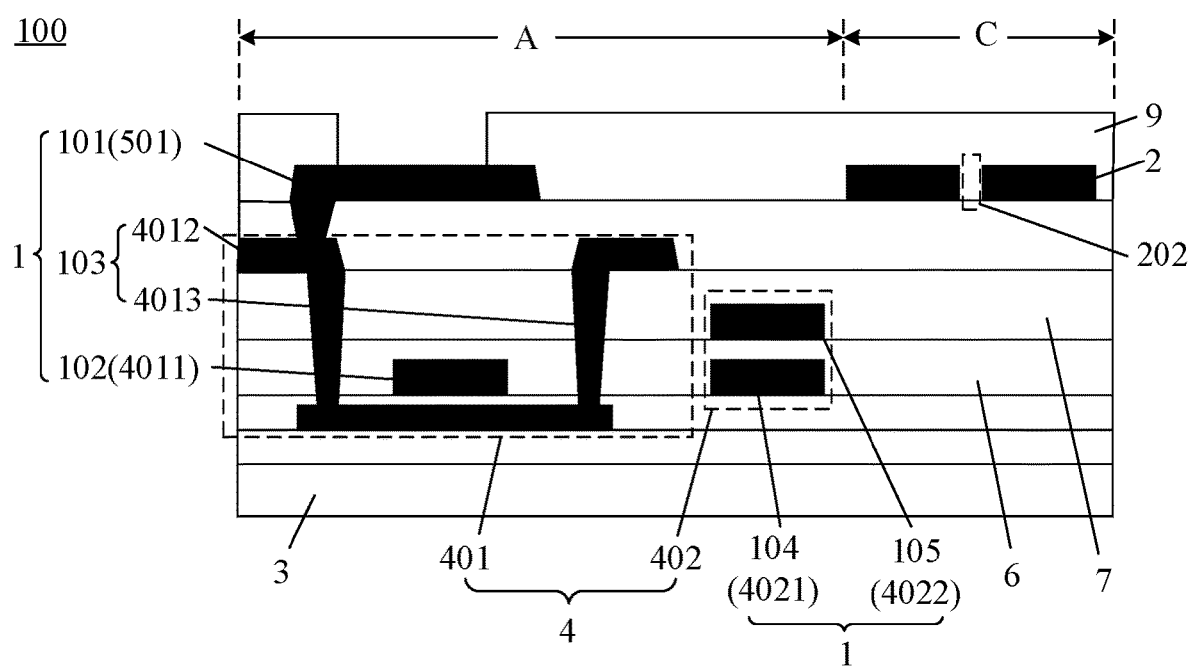
FIG. 4 is a structural diagram of a flexible display panel, in accordance with some embodiments of the present disclosure.
Figure 7:
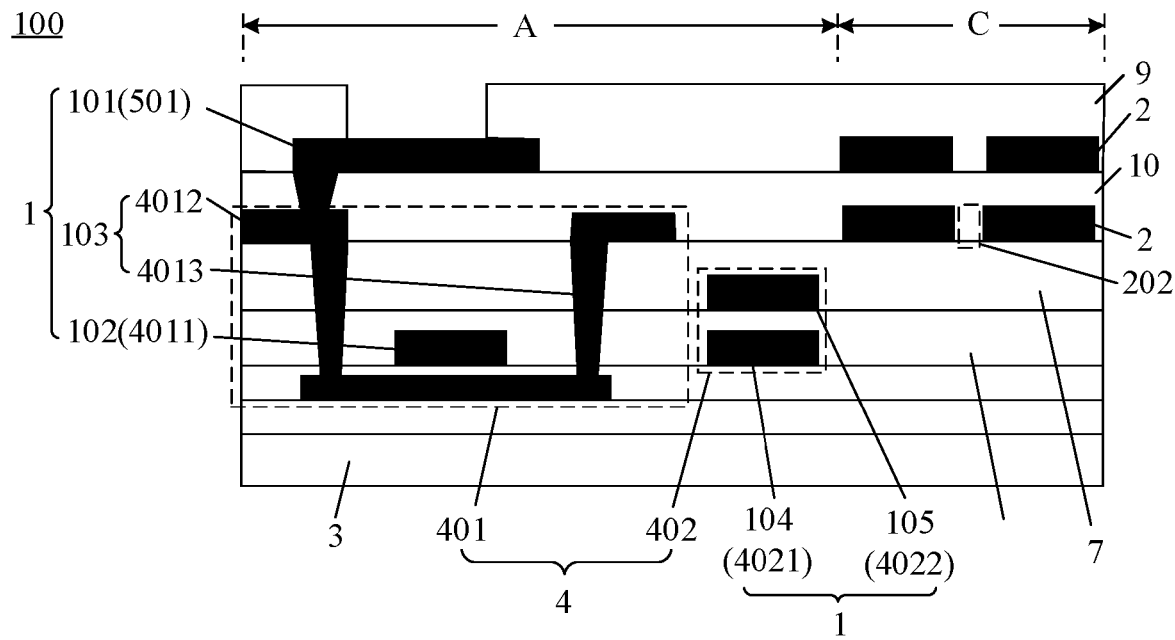
FIG. 7 is a structural diagram of yet another flexible display panel, in accordance with some embodiments of the present disclosure.

FIG. 4 shows a case where the interdigital capacitor 2 is disposed in the same layer with the same material as the anode layer 101. FIG. 7 shows a case where the plurality of interdigital capacitor 2 are disposed in the same layers with the same materials as the anode layer 101 and the source-drain layer 103.

In the flexible display panel 100 provided by the embodiments of the present disclosure, the at least one interdigital capacitor 2 is disposed in the overlapping area(s) D of the bending area C and the peripheral area B, and the at least one interdigital capacitor 2 is disposed in the same layer with the same material as at least one conductive layer 1 of the plurality of conductive layers 1 in the display area A, which may not only avoid increasing the thickness of the flexible display panel 100, but also simplify the manufacturing process of the flexible display panel 100, and reduce the production cost of the flexible display panel 100.

In some embodiments, the driving circuit 4 generally further includes a switch thin film transistor.

A structure of the driving circuit 4 is diverse, such as a "2T1C", "6T1C", "7T1C", "6T2C" or "7T2C" structure. Herein, "T" indicates a thin film transistor, and the number before "T" indicates a number of thin film transistors; "C" indicates a storage capacitor, and the number before "C" indicates a number of storage capacitors. In each of the above structures, one of thin film transistors is a driving thin film transistor, and the remaining thin film transistor(s) are switch thin film transistor(s).

Figure 3:
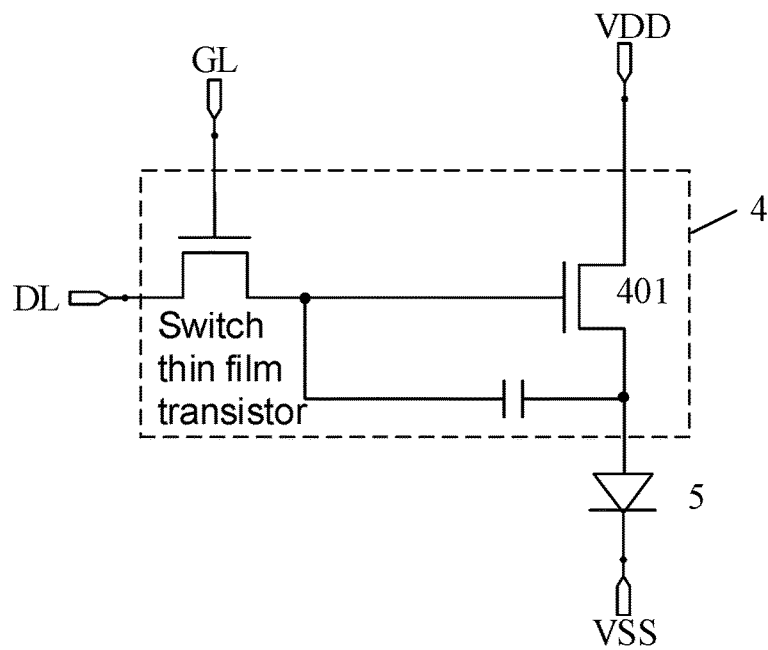
FIG. 3 is an equivalent circuit diagram of a driving circuit and a light-emitting device, in accordance with some embodiments of the present disclosure.

For example, the driving circuit 4 has the "2T1C" structure, and the structure of the driving circuit 4 is schematically described below. An equivalent circuit diagram of the driving circuit 4 and the light-emitting device 5 is shown in FIG. 3. For example, a structure of the switch thin film transistor in the "2T1C" structure is the same as a structure of the driving thin film transistor 401.

Figure 5:
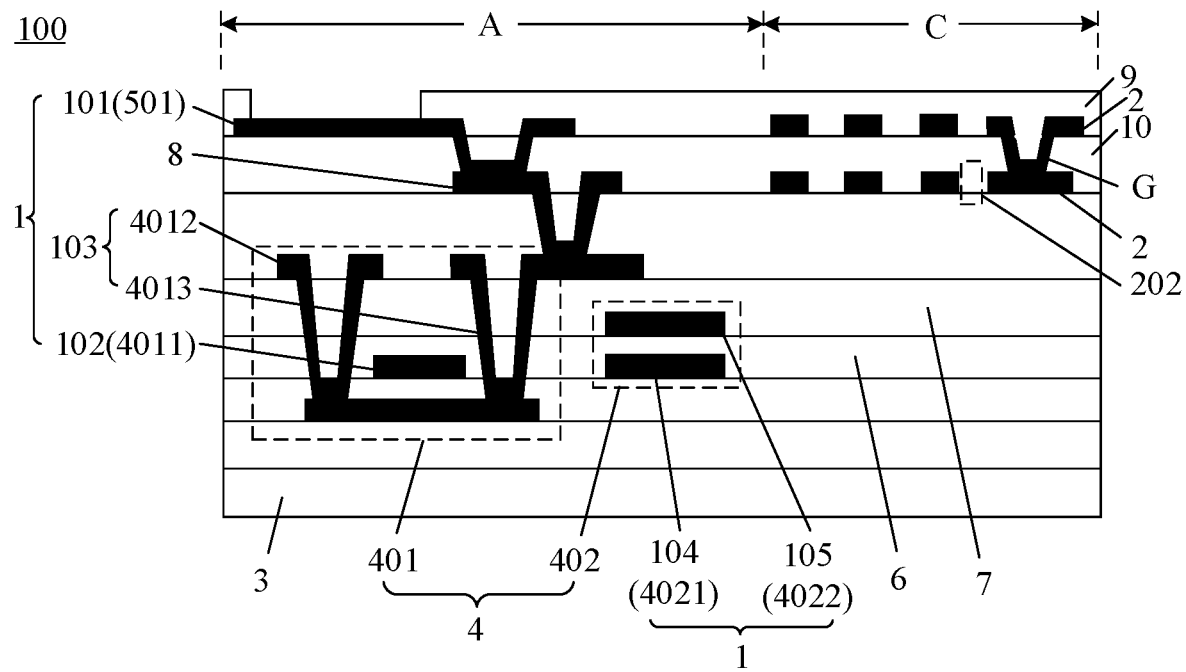
FIG. 5 is a structural diagram of another flexible display panel, in accordance with some embodiments of the present disclosure.

As shown in FIG. 3, a gate of the switch thin film transistor is electrically connected to a gate line (abbreviated as GL), a source of the switch thin film transistor is electrically connected to a data line (abbreviated as DL), a drain of the switch thin film transistor is electrically connected to a gate 4011 of the driving thin film transistor 401 and the first electrode 4021 of the storage capacitor 402, a source 4012 of the driving thin film transistor 401 is electrically connected to a power supply terminal (i.e., Voltage Drain-Drain, abbreviated as VDD), a drain 4013 of the driving thin film transistor 401 is electrically connected to the anode 501 of the light-emitting device 5 and the second electrode 4022 of the storage capacitor 402, and a cathode of the light-emitting device 5 is electrically connected to a common electrode terminal (i.e., Voltage Source-to-Source, abbreviated as VSS). Or, the gate of the switch thin film transistor is electrically connected to the GL, the drain of the switch thin film transistor is electrically connected to the DL, the source of the switch thin film transistor is electrically connected to the gate 4011 of the driving thin film transistor 401 and the first electrode 4021 of the storage capacitor 402, the drain 4013 of the driving thin film transistor 401 is electrically connected to the VDD, the source 4012 of the driving thin film transistor 401 is electrically connected to the anode 501 of the light-emitting device 5 and the second electrode 4022 of the storage capacitor 402, and the cathode of the light-emitting device 5 electrically connected to the VSS. In this way, as shown in FIG. 5, in a case where the GL outputs a high level, the switch thin film transistor is turned on, an input signal on the DL is transmitted to the gate 4011 of the driving thin film transistor 401, and the storage capacitor 402 is charged. In a case where the GL outputs a low level and the VDD outputs a high level, the storage capacitor 402 provides a high level for the gate 4011 of the driving thin film transistor 401, so that the driving thin film transistor 401 is turned on, thereby causing the light-emitting device 5 to emit light.

In some embodiments, the first electrode layer 104 and the second electrode layer 105 have various arrangements.

In some examples, as shown in FIG. 4, the first electrode layer 104 and the gate layer 102 are in the same film (that is, the first electrode layer 104 and the gate layer 102 are disposed in the same layer with the same material), and the second electrode layer 105 is disposed between the gate layer 102 and the source-drain layer 103. The flexible display panel 100 further includes a fourth insulating layer 6 disposed between the gate layer 102 and the second electrode layer 105, and a fifth insulating layer 7 disposed between the second electrode layer 105 and the source-drain layer 103. The fifth insulating layer 7 is provided with a second through hole therein, and the second electrode 4022 in the second electrode layer 105 is electrically connected to the drain 4013 in the source-drain layer 103 by the second through hole in the fifth insulating layer 7.

The manufacturing process of the flexible display panel 100 may be simplified by setting the first electrode layer 104 and the gate layer 102 in the same film. A number of the conductive layers 1 may be increased by setting the second electrode layer 105 between the gate layer 102 and the source-drain layer 103. In this way, the selectivity of a position where the interdigital capacitor 2 is disposed in the overlapping area D of the bending area C and the peripheral area B may be increased.

In some other examples, the first electrode layer 104 and the second electrode layer 105 are different films. Each of the first electrode layer 104 and the second electrode layer 105 is in the same film as one of: the gate layer 102, the source-drain layer 103, and the anode layer 101. That is, the first electrode layer 104 and the second electrode layer 105 may be obtained by extensions of any two conductive layers 1 of the flexible display panel 100. In this way, a number of films in the flexible display panel 100 may be reduced, and the thickness of the flexible display panel 100 may be decreased.

Figure 8:
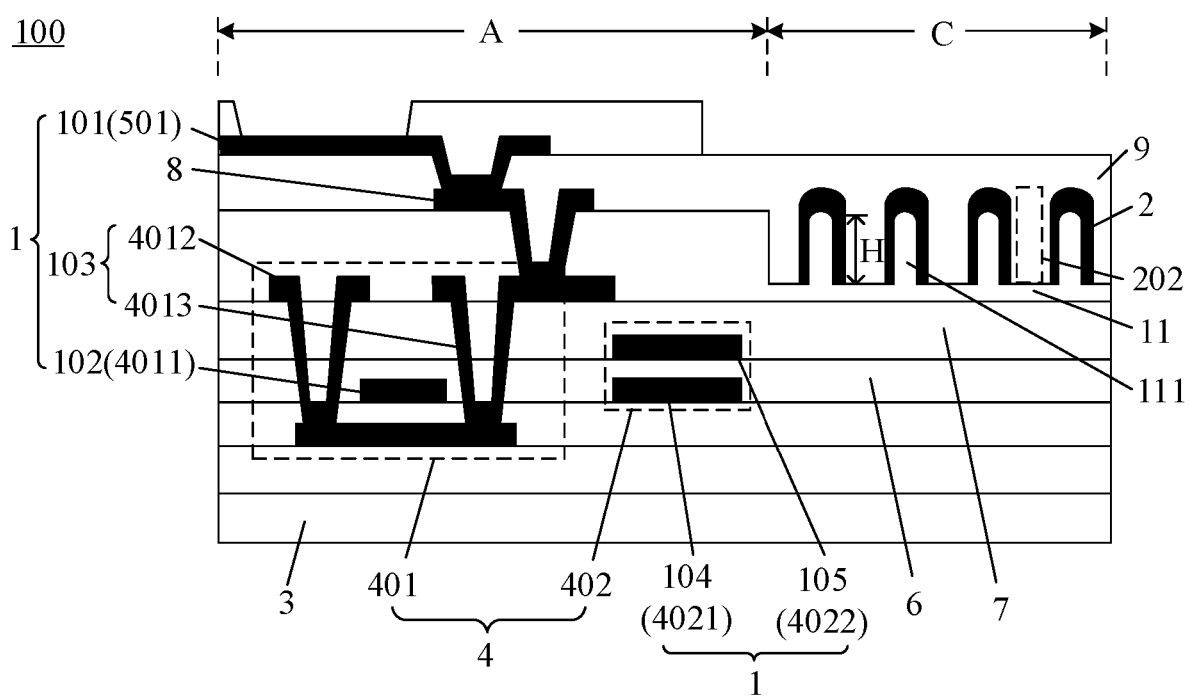
FIG. 8 is a structural diagram of yet another flexible display panel, in accordance with some embodiments of the present disclosure.

In some embodiments, as shown in FIGS. 5 and 8, the flexible display panel 100 further includes an auxiliary electrode layer 8 disposed between the source-drain layer 103 and the anode layer 101. The auxiliary electrode layer 8 is electrically connected to the anode layer 101 and the drain 4013 in the source-drain layer 103. In this case, the conductive layers 1 further include the auxiliary electrode layer 8.

By providing the auxiliary electrode layer 8, the number of conductive layers 1 may be increased, and the selectivity of the position where the interdigital capacitor 2 is disposed in the overlapping area D may be increased. Moreover, a size of the drain 4013 of the driving thin film transistor 401 may be reduced without increasing a resistance, and a pixel density or aperture ratio of the flexible display panel 100 may be increased.

In some embodiments, a structure of the interdigital capacitor 2 may be: each interdigital capacitor 2 including two interdigital capacitor plates 201 arranged crosswise. Each interdigital capacitor plate 201 includes a plurality of interdigital fingers 2011 and a bending sensing portion 2012 connected to the plurality of interdigital fingers 2011. Extending directions of the plurality of interdigital fingers 2011 are the same as or substantially the same as an extending direction of a bending axis of the bending area C (as shown by dotted line aa' in FIGS. 1 and 2). An extending direction of the bending sensing portion 2012 crosses the extending direction of the bending axis aa' of the bending area C (that is, there is an included angle between the extending direction of the bending sensing portion 2012 and the extending direction of the bending axis aa').

The plurality of interdigital fingers 2011 have various structures, and a specific structure is not limited. For example, a structure of each interdigital finger 2011 may be a plane rectangular strip (i.e., a strip having a plane pattern as a rectangular). In this way, a facing area between two adjacent interdigital fingers 2011 is an area of facing portions of two plane rectangular strips.

Here, in a case where a voltage difference between two interdigital capacitor plates 201 in the same interdigital capacitor 2 is constant, a capacitance value of this interdigital capacitor 2 is proportional to the facing area between two adjacent interdigital fingers 2011, and inversely proportional to a space d between two adjacent interdigital fingers 2011.

On this basis, in a case where the facing area between two adjacent interdigital fingers 2011 is constant, the smaller the space d between two adjacent interdigital fingers 2011, the larger the capacitance value of the interdigital capacitor 2; and the greater the space d between two adjacent interdigital fingers 2011, the smaller the capacitance value of the interdigital capacitor 2.

In a case where the flexible display panel 100 bends in the bending axis aa', the space d between every two adjacent interdigital fingers 2011 changes as the bending state of the flexible display panel 100 changes. In a case where the facing area of every two adjacent interdigital fingers 2011 is constant, a capacitance value between every two adjacent interdigital fingers 2011 changes as the space d changes. That is, the capacitance value of the interdigital capacitor 2 changes as the space d changes. In this way, a change of the capacitance of the interdigital capacitor 2 may be sensed and the bending state of the flexible display panel 100 may be determined, by providing an external circuit.

Figure 2:
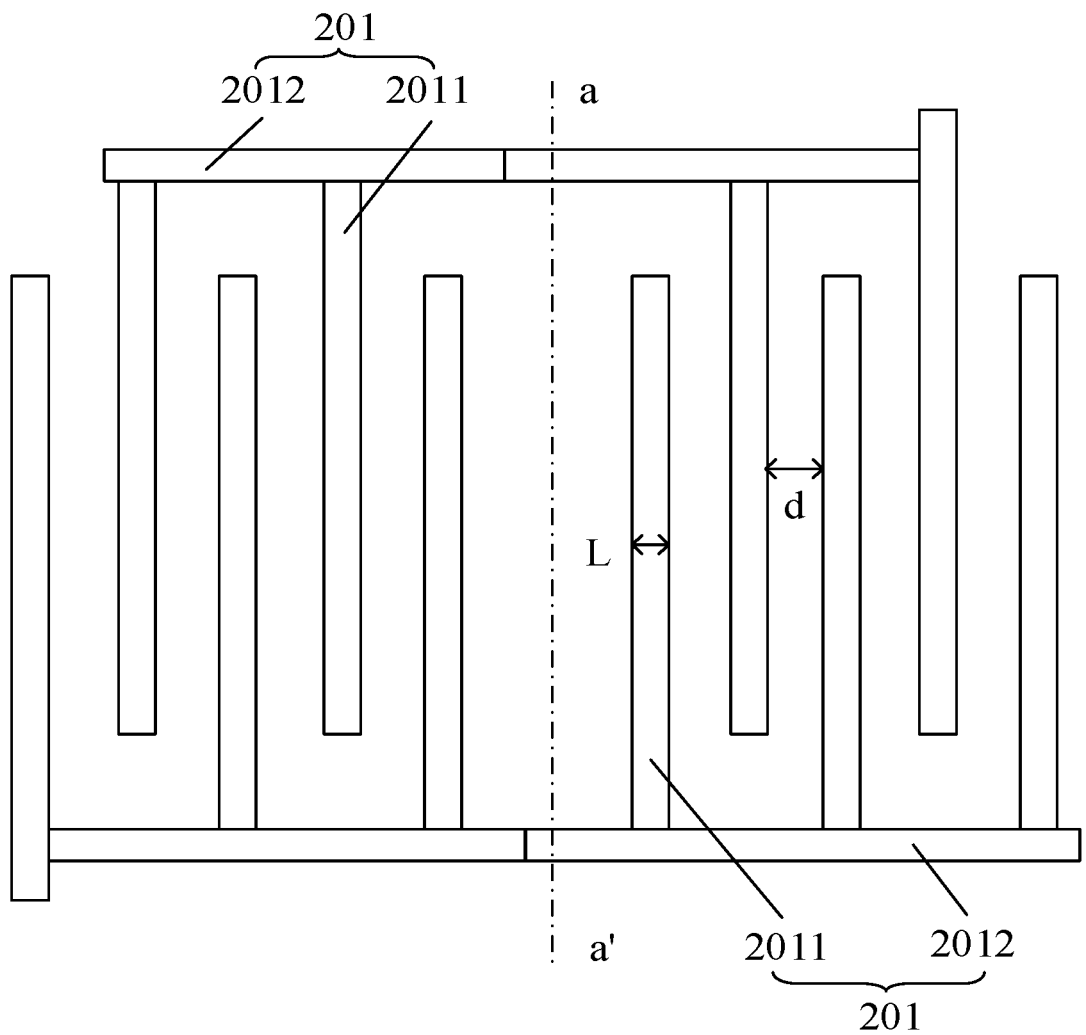
FIG. 2 is a structural diagram of an interdigital capacitor, in accordance with some embodiments of the present disclosure.

In some embodiments, as shown in FIG. 2, the space d between every two adjacent interdigital fingers 2011 is within a range from 3 μm to 5 μm, inclusive. A dimension L of each interdigital finger 2011 in a direction perpendicular to its own extending direction is within a range from 3 μm to 5 μm, inclusive.

In some embodiments, as shown in FIGS. 4, 5, 7 and 8, the flexible display panel 100 further includes a third insulating layer 9 covering the interdigital capacitor 2. A portion of the third insulating layer 9 fills between every two adjacent interdigital fingers 2011 of the interdigital capacitor 2 to form an insulating medium 202 in the interdigital capacitor 2.

For example, the interdigital capacitor 2 and the anode layer 101 are disposed in the same layer with the same material, the third insulating layer 9 covering the anode layer 101 and the interdigital capacitor 2 may be referred to as a pixel defining layer, as shown in FIG. 4. In a process of actually forming the pixel defining layer, the pixel defining layer may be retained in the overlapping area D. In this way, a portion of the pixel defining layer filling between every two adjacent interdigital fingers 2011 constitutes the insulating medium 202 in the interdigital capacitor 2. When the flexible display panel 100 bends in the bending axis aa', the bending sensing portion 2012 in the interdigital capacitor 2 deforms under the action of stretching or squeezing, so that the space d between two adjacent interdigital fingers 2011 is increased or decreased, and a stretching deformation or compression deformation occurs in the insulating medium, thereby in turn causing the capacitance value of the interdigital capacitor 2 to change. The change of the capacitance value of the interdigital capacitor 2 is sensed by the external circuit, so as to determine the bending state of the flexible display panel 100.

In some examples, a material with great elasticity and high dielectric coefficient may be selected as the insulating medium, such as a silicon-based organic material.

In the embodiments of the present disclosure, there are various ways of setting the interdigital capacitor 2 in the overlapping area D, which is not limited by some embodiments of the present disclosure, and may be selectively set according to actual needs.

In some embodiments, the flexible display panel 100 includes a plurality of interdigital capacitors 2, and the plurality of interdigital capacitors 2 are disposed in the same layers with the same materials as at least two conductive layers 1 of the plurality of conductive layers 1 in the display area A. The flexible display panel 100 further includes a first insulating layer 10 disposed between every two adjacent conductive layers 1 in at least two conductive layers 1. The first insulating layer 10 is provided with first through holes G therein, and interdigital capacitors 2 located in different layers are connected in parallel by the first through holes G in the first insulating layer 10 between layers where the interdigital capacitors 2 are located. The interdigital capacitors 2 connected in parallel may be located in the same overlapping area D.

Here, since the interdigital capacitors 2 located in different layers are connected in parallel by the first through holes G, in an actual manufacturing process, the interdigital capacitors 2 located in different layers and connected in parallel are all disposed in the same overlapping area D of the bending area C and the peripheral area B.

Figure 6:
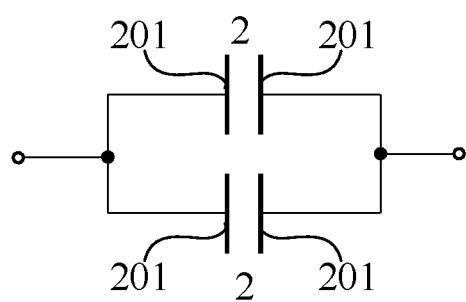
FIG. 6 is an equivalent circuit diagram of interdigital capacitors connected in parallel, and respectively disposed in the same layers with the same materials as two conductive layers, in accordance with some embodiments of the present disclosure.

For example, the plurality of interdigital capacitors 2 are disposed in the same layers with the same materials as the anode layer 101 and the auxiliary electrode layer 8 in the display area A. As shown in FIG. 5, the interdigital capacitors 2 located in different layers connected in parallel by the first through holes G of the first insulating layer 10 between them means that, in two layers of interdigital capacitors, one interdigital capacitor plate 201 in each interdigital capacitor 2 is connected to a potential (i.e., a first voltage terminal), the other interdigital capacitor plate 201 in the interdigital capacitor 2 is connected to another potential (i.e., a second voltage terminal), and FIG. 6 shows an equivalent circuit diagram of the two layers of interdigital capacitors 2. When the flexible display panel 100 bends in the bending axis aa', all capacitance values of the interdigital capacitors 2 located in different layers change, and a total change value of the capacitances is equal to a sum of the change values of the capacitances of the interdigital capacitors 2 in layers.

The total capacitance can be enlarged by setting the interdigital capacitors 2 located in different layers and in parallel connection by the first through holes G in the first insulating layer 10 between the interdigital capacitors 2. In the case where the flexible display panel 100 bends, a change value of the total capacitance is large, so that when the change value of the capacitance is detected by the external circuit, the detection sensitivity may be improved. Moreover, in a case of ensuring that the change value of the capacitance of the interdigital capacitor 2 may be detected effectively, an area of each interdigital capacitor 2 may be reduced by setting the plurality of interdigital capacitors 2 in different layers, and a narrow-bezel design of the flexible display panel 100 is conducive to being realized. In addition, since the interdigital capacitors 2 located in different layers are connected in parallel by the first through holes G, it is possible to only provide lead wires on interdigital capacitor(s) 2 in one layer. In this way, a constant voltage difference may be only provided to two interdigital capacitor plates 201 of the interdigital capacitor(s) 2, which simplifies the manufacturing process of the flexible display panel 100.

In some other embodiments, the flexible display panel 100 includes a plurality of interdigital capacitors 2, the plurality of interdigital capacitors 2 are disposed in the same layers with the same materials as at least two conductive layers 1 of the plurality of conductive layers 1. At least two interdigital capacitors 2 of the plurality of interdigital capacitors 2 are located in the same overlapping area D of the bending area C and the peripheral area B.

For example, as shown in FIG. 7, the at least two interdigital capacitors 2 located in the same overlapping area D are disposed in the same layers with the same materials as the anode layer 101 and the source-drain layer 103 in the display area A.

In a case where metal electrodes (e.g., interdigital capacitor plates) of the interdigital capacitor(s) 2 in one layer are broken due to the bending of the flexible display panel 100, by providing the plurality of interdigital capacitors 2 and setting the plurality of interdigital capacitors 2 in the same layers with the same materials as at least two conductive layers 1, the effect on the detection of the bending state of the flexible display panel 100 by other interdigital capacitors 2 may be avoided.

In yet some other embodiments, the flexible display panel 100 includes a plurality of interdigital capacitors 2, the plurality of interdigital capacitors 2 are disposed in the same layer with the same material as one conductive layer 1 of the plurality of conductive layers 1. The plurality of interdigital capacitors 2 are located in different overlapping areas D of the bending area C and the peripheral area B.

For example, as shown in FIG. 4, the plurality of interdigital capacitors 2 are disposed in the same layer with the same material as the anode layer 101 of the plurality of conductive layers 1, and are located in different overlapping areas D. Each overlapping area D is provided with one or more interdigital capacitors 2 therein, which is not limited in the present example.

By setting the plurality of interdigital capacitors 2 in different overlapping areas D, the plurality of interdigital capacitors 2 can be used to represent the bending degree of different parts of the flexible display panel 100 in the bending region C, which is conducive to improving the accuracy of determining the bending state of the flexible display panel 100.

In yet some other embodiments, as shown in FIG. 8, the flexible display panel 100 further includes a second insulating layer 11 disposed under the interdigital capacitor 2 (i.e., disposed on a side of the interdigital capacitor 2 proximate to the base 3). The second insulation layer 11 includes a plurality of strip-shaped protrusions 111 arranged at intervals and in parallel, and extending directions of the strip-shaped protrusions 111 are the same as or substantially the same as the extending direction of the bending axis aa' of the bending region C. The plurality of interdigital fingers 2011 in the interdigital capacitor plates 201 of the interdigital capacitor 2 are conductive films covering the plurality of strip-shaped protrusions.

In some examples, a shape of a vertical section of the interdigital finger 2011 may be an arch as shown in FIG. 8. The facing area of two adjacent interdigital fingers 2011 is equal to a product of a thickness H of and a length of one strip-shaped protrusion 111. The plurality of strip-shaped protrusions 111 are provided, and the conductive films are covered on the plurality of strip-shaped protrusions 111 to form the plurality of interdigital fingers 2011, in this way, the facing area between two adjacent interdigital fingers 2011 may be increased. According to the formula $\Delta C=\varepsilon \times S/\Delta d$, it can be seen that in a case where the deformation (i.e., a change value of a distance between two adjacent interdigital fingers 2011, as shown by $\Delta d$ in the formula) in the interdigital capacitor 2 is constant, the greater the facing area (i.e., S in the formula) between the two adjacent interdigital fingers 2011, the greater the change value of the capacitance (i.e., $\Delta C$ in the formula), which is conducive to improving the detection sensitivity. Moreover, in a case of ensuring that the change value of the capacitance of the interdigital capacitor 2 may be effectively detected, it is conducive to reducing a manufacturing area of the interdigital capacitor 2.

Here, the thickness H of each strip-shaped protrusion 111 is not specifically limited, which may be properly set as needed in practical applications.

In some embodiments, the thickness H of the strip-shaped protrusion 111 is within a range from 1 μm to 3 μm, inclusive.

It will be noted that the second insulating layer 11 located under each layer of interdigital capacitor(s) 2 may be have a single-layer structure or a multi-layer structure, which is not specifically limited herein.

FIG. 8 shows a case where the interdigital capacitor 2 is disposed in the same layer with the same material as the auxiliary electrode layer 8, and the second insulating layer 11 under the interdigital capacitors 2 includes the plurality of strip-shaped protrusions 111 formed above the base 3 and arranged at intervals and in parallel.

There are various manufacturing methods of the flexible display panel 100 in the above embodiments, which is not limited by some embodiments of the present disclosure, and may be selectively set according to actual needs.

In some embodiments, in an example where the interdigital capacitor 2 is manufactured in the same layer with the same material as the anode layer 11 in the display area A, a manufacturing method of the flexible display panel includes S100a to S400a.

In S100a, as shown in FIG. 4, a buffer layer is deposited on the base 3 (e.g., a polyimide flexible base) with a thickness of 5 μm to 10 μm. The buffer layer is, for example, a composite layer of a silicon nitride film and a silicon oxide film. A lower layer in the composite layer is the silicon nitride film with a thickness of 500±5% A, and an upper layer is the silicon oxide film with a thickness of 3500±5% A.

In S200a, as shown in FIG. 4, an amorphous silicon layer with a thickness of 500±5% A is deposited on a surface of the buffer layer facing away from the base 3. After dehydrogenation treatment, the amorphous silicon layer is converted into a polysilicon layer by excimer laser annealing (abbreviated as ELA) process. Processes such as exposure and etching are performed on the polysilicon layer to form an active layer. Then, a gate insulating layer, the gate 4011, a first interlayer insulating layer (i.e., the fourth insulating layer 6), a second interlayer insulating layer (i.e., the fifth insulating layer 7), the source-drain layer 103, and the first electrode 4021 and the second electrode 4022 of the storage capacitor 402 are all formed above a surface of the active layer facing away from the base 3.

In S300*a*, as shown in FIG. 4, a planarization layer is deposited on a surface of the source-drain layer 103 facing away from the base 3, and an entire layer including the anode 501 and the like to be formed is deposited on a surface of the planarization layer facing away from the base 3. The layer extends into the overlapping area D of the peripheral area B and the bending area C. A single patterning process is performed on the layer to form the anode 501 located in the display area A and the interdigital capacitor 2 located in the overlapping area D. Here, in the formed interdigital capacitor 2, a width of the interdigital finger 2011 is within a range from 3 μm to 5 μm, inclusive, and the space d between two adjacent interdigital fingers 2011 is within a range from 3 μm to 5 μm, inclusive. The structure of the interdigital finger 2011 may be a plane rectangular strip, and a thickness of the interdigital finger 2011 may be the same as a thickness of the anode 501.

In S400*a*, as shown in FIG. 4, the pixel defining layer is formed on a surface of the anode 501 facing away from the base 3 by a patterning process, and the pixel defining layer extends into the overlapping area D of the bending region C and the peripheral area B. In this way, a portion of the pixel defining layer may fill between two adjacent interdigital fingers 2011 to constitute the insulating medium in the interdigital capacitor 2. A material of the pixel defining layer may be a silicon-based organic material.

In some other embodiments, in an example where the plurality of interdigital capacitors 2 connected in parallel are formed in the same layers with the same materials as the auxiliary electrode layer 8 and the anode layer 101 in the display area A, a manufacturing method of the flexible display panel includes S100*b* to S600*b*.

In S100*b*, as shown in FIG. 5, this step is basically the same as S100*a* in some embodiments described above, and will not be repeated here.

In S200*b*, as shown in FIG. 5, this step is basically the same as S200*a* in some embodiments described above, and will not be repeated here.

In S300*b*, as shown in FIG. 5, a third interlayer insulating layer is deposited on a surface of the source-drain layer 103 facing away from the base 3, and a through hole for connecting the auxiliary electrode layer 8 and the drain 4013 is formed in the third interlayer insulating layer.

In S400*b*, as shown in FIG. 5, a first metal film is deposited on a surface of the third interlayer insulating layer facing away from the base 3, and processes such as exposure and etching are performed on the first metal film to form the auxiliary electrode layer 8 located in the display area A and an interdigital capacitor 2 located in the overlapping area D of the bending region C and the peripheral area B. Here, in the formed interdigital capacitor 2, the width of the interdigital finger 2011 is within a range from 3 μm to 5 μm, inclusive, and the space between two adjacent interdigital fingers 2011 is within a range from 3 μm to 5 μm, inclusive. The structure of the interdigital finger 2011 may be a plane rectangular strip, and the thickness of the interdigital finger 2011 may be the same as a thickness of the auxiliary electrode layer 8.

In S500*b*, as shown in FIG. 5, a fourth interlayer insulating layer (i.e., the first insulating layer 10) is deposited on a surface of the auxiliary electrode layer 8 facing away from the base 3. Through holes for connecting the auxiliary electrode layer 8 and the anode layer 101 to be formed are formed in the fourth interlayer insulating layer. The through holes G, for connecting the interdigital capacitor 2 disposed in the same layer with the same material as the auxiliary electrode layer and an interdigital capacitor 2 to be formed disposed in the same layer with the same material as the anode layer 101, are formed in the fourth interlayer insulating layer.

In S600*b*, as shown in FIG. 5, a second metal layer is deposited on a surface of the fourth interlayer insulating layer facing away from the base 3. Processes such as exposure and etching are performed on the fourth interlayer insulating layer to form the anode layer 101 located in the display area A and the interdigital capacitor 2 in the overlapping area D of the bending area C and the peripheral area B. This interdigital capacitor 2 is connected in parallel to the interdigital capacitor 2 disposed in the same layer with the same material as the auxiliary electrode layer 8 by the through holes G disposed in the fourth interlayer insulating layer. Here, in the interdigital capacitor 2 disposed in the same layer with the same material as the anode layer 101, the width of the interdigital finger 201 is within a range from 3 μm to 5 μm, inclusive, and the space d between two adjacent interdigital fingers 2011 is within a range from 3 μm to 5 μm, inclusive. The structure of the interdigital finger 2011 may be a plane rectangular strip, and the thickness of the interdigital finger 2011 may be the same as the thickness of the anode layer 101.

Here, the above embodiments provide the manufacturing method of the flexible display panel including two layers of interdigital capacitors 2 connected in parallel. It will be noted that for a flexible display panel including three or more layers of interdigital capacitors 2 connected in parallel, it may also be manufactured by a similar method.

In yet some other embodiments, in an example where the interdigital capacitor 2 is manufactured in the same layer with the same material as the auxiliary electrode layer 8 in the display area A, and the interdigital fingers 2011 are formed on the strip-shaped protrusions 111, a manufacturing method of the flexible display panel includes S100*c* to S500*c*.

In S100*c*, as shown in FIG. 8, this step is basically the same as S100*a* in some embodiments described above, and will not be repeated here.

In S200*c*, as shown in FIG. 8, this step is basically the same as S200*a* in some embodiments described above, and will not be repeated here.

In S300*c*, as shown in FIG. 8, a fifth interlayer insulating layer (i.e., the second insulating layer 11) is deposited on a surface of the source-drain layer 103 facing away from the base 3. By a single patterning process, a through hole for connecting the auxiliary electrode layer 8 and the drain 4013 are formed in a portion of the fifth interlayer insulating layer located in the display area A, and the plurality of strip-shaped protrusions 111 disposed at intervals and in parallel are formed in a portion of the fifth interlayer insulating layer located in the overlapping area D of the bending area C and the peripheral area B. Extending directions of the plurality of strip-shaped protrusions 111 are the same as or substantially the same as the extending direction of the bending axis aa' of the bending area C.

In S400*c*, as shown in FIG. 8, a first metal layer is formed on a surface of the fifth interlayer insulating layer facing away from the base 3 and extends to the overlapping area D of the bending area C and the peripheral area B. A single patterning process is performed on the first metal layer, so as to form the auxiliary electrode layer 8 located in the display area A, the interdigital fingers 2011 and the bending sensing portion 2012 connecting the plurality of interdigital fingers 2011 that are located in the overlapping area D of the bending area C and the peripheral area B, and electrode lead wires.

In S500c, as shown in FIG. 8, on the basis of S400c, the anode layer 101, the pixel defining layer, or the like are manufactured.

Here, the above embodiments provide a manufacturing method of the interdigital capacitor 2 disposed in the same layer with the same material as one conductive layer 1, which has the interdigital fingers 2011 formed on the strip-shaped protrusions 111. It will be noted that, in the case where the plurality of interdigital capacitors 2 are disposed in the same layers with the same materials as at least two conductive layers 1, each layer of interdigital capacitor(s) 2 may be formed by a similar method. In a case where a plurality of layers of interdigital capacitors 2 are connected in parallel to each other, these interdigital capacitors 2 may also be formed by a similar method provided in some embodiments described above.

Figure 9:
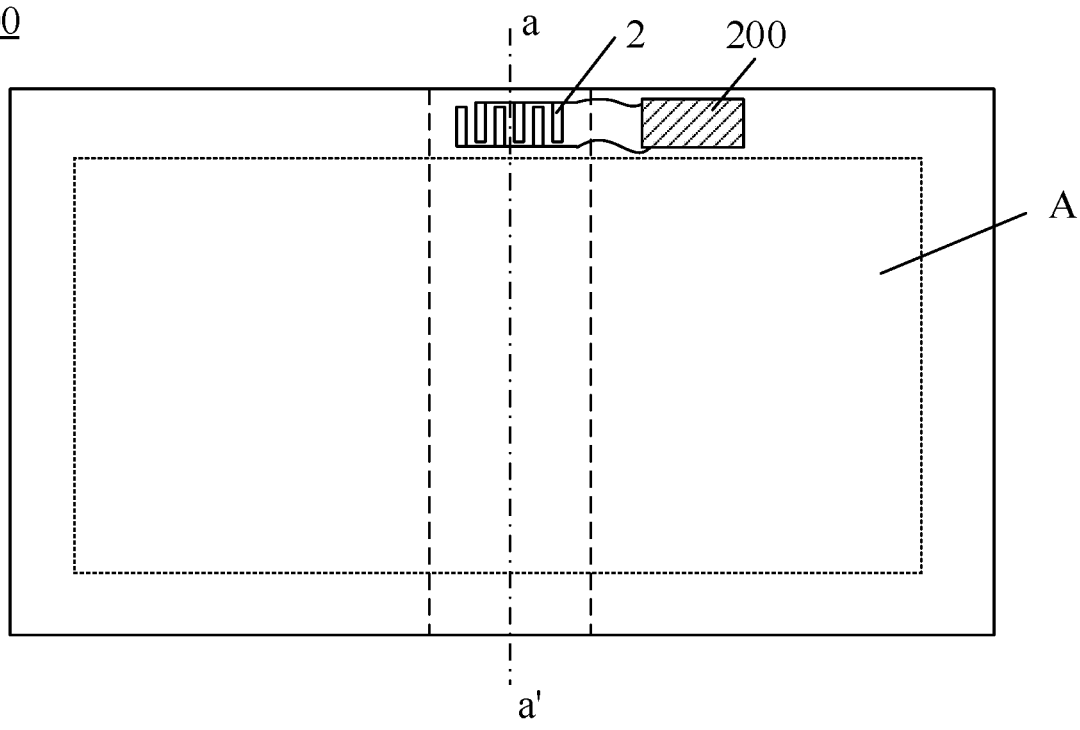
FIG. 9 is a structural diagram of a display apparatus, in accordance with some embodiments of the present disclosure.
Figure 10:
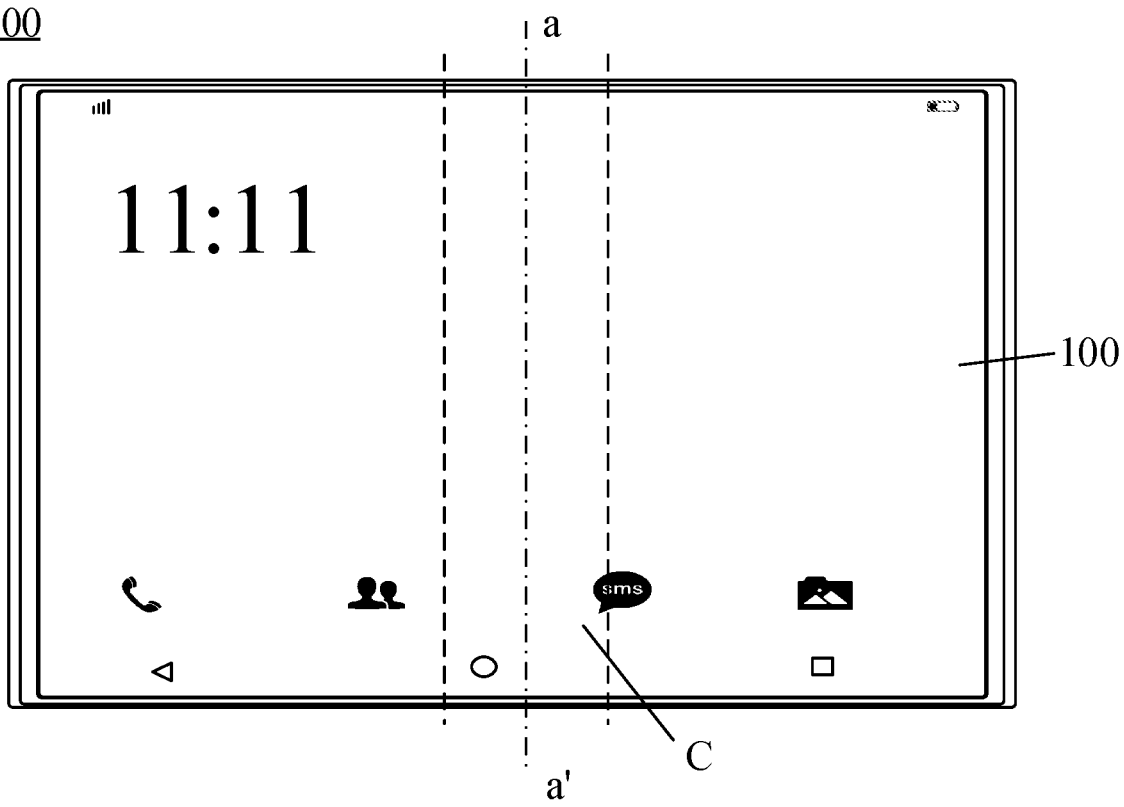
FIG. 10 is a structural diagram of another display apparatus, in accordance with some embodiments of the present disclosure.

Some embodiments of the present disclosure provide a display apparatus 1000. As shown in FIGS. 9 and 10, the display apparatus 1000 includes the flexible display panel 100 as provided in some embodiments described above. In the case where each interdigital capacitor 2 in the flexible display panel 100 includes two interdigital capacitor plates 201, as shown in FIG. 6, the two interdigital capacitor plates 201 are connected to a first voltage terminal and a second voltage terminal, respectively. The first voltage terminal is a high voltage terminal, and the second voltage terminal is a low voltage terminal; or, the second voltage terminal is a high voltage terminal, and the first voltage terminal is a low voltage terminal.

Here, the high voltage terminal and the low voltage terminal are relative, and the specific voltage is not limited. For example, a voltage at the high voltage terminal may be 10 V, and a voltage at the low voltage terminal may be 5 V.

In some embodiments, the display apparatus 1000 further includes a detection circuit 200 electrically connected to the interdigital capacitor 2. The two interdigital capacitor plates 201 of the interdigital capacitor 2 are also electrically connected to the detection circuit 200. The detection circuit 200 is configured to determine the bending state of the flexible display panel 100 according to the change value of the capacitance of the interdigital capacitor 2.

In the display apparatus 1000 provided by the embodiments of the present disclosure, by applying a constant voltage difference to the two interdigital capacitor plates 201 of the interdigital capacitor 2, the capacitance of each interdigital capacitor 2 changes as the space d between the two adjacent interdigital fingers 211 changes when the display apparatus 1000 bends. In this way, the change value of the capacitance of the interdigital capacitor 2 is detected by the detection circuit, so that a bending state of the display apparatus 1000 can be detected.

In some examples, the detection circuit 200 may be designed as a circuit that is capable of converting the change value of the capacitance into a change value of a voltage, and then determining the bending state of the display apparatus 1000 according to the change value of the voltage.

It will be noted that, in a case where there are a plurality of interdigital capacitors 2 that are disposed in the same layers with the same materials as at least two conductive layers 1 in the display area A, and the interdigital capacitors 2 located in different layers are connected in parallel to each other, the detected change value of the capacitance is equal to the sum of the change values of the capacitances of layers of the interdigital capacitors 2. In this way, in the case where the deformation quantity of each interdigital capacitor 2 is constant, the total change value of the capacitance can be increased, thereby improving the detection sensitivity.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flexible display panel, having a display area, a peripheral area surrounding the display area, and a bending area having at least one overlapping area with the peripheral area, the flexible display panel comprising:
   a plurality of conductive layers disposed in the display area; and
   at least one interdigital capacitor disposed in the at least one overlapping area, one of the at least one interdigital capacitor being disposed in a same layer with a same material as one of the plurality of conductive layers,
   wherein each interdigital capacitor includes two interdigital capacitor plates arranged crosswise,
   wherein each interdigital capacitor plate includes:
      a plurality of interdigital fingers, extending directions of the plurality of interdigital fingers being parallel to or substantially parallel to an extending direction of a bending axis of the bending area; and
      a bending sensing portion connected to the plurality of interdigital fingers, an extending direction of the bending sensing portion crossing the extending direction of the bending axis of the bending area,
   the flexible display panel further comprising:
      a second insulating layer disposed under the interdigital capacitor,
   wherein the second insulating layer includes a plurality of strip-shaped protrusions arranged at intervals and in parallel, and extending directions of the plurality of strip-shaped protrusions are parallel to or substantially parallel to the extending direction of the bending axis of the bending area, and
   wherein the plurality of interdigital fingers in the interdigital capacitor plates of the interdigital capacitor are conductive films covering the plurality of strip-shaped protrusions, and the plurality of interdigital fingers are in one-to-one correspondence with the plurality of strip-shaped protrusions.

2. The flexible display panel according to claim 1, wherein the at least one interdigital capacitor includes a plurality of interdigital capacitors,
   wherein a first interdigital capacitor in the plurality of interdigital capacitors is disposed in a same layer with a same material as one of at least two conductive layers of the plurality of conductive layers, and a second interdigital capacitor in the plurality of interdigital capacitors is disposed in a same layer with a same material as another one of the at least two conductive layers, wherein the flexible display panel further comprises:
a first insulating layer disposed between every two adjacent conductive layers in the at least two conductive layers, and
wherein the first insulating layer is provided with a plurality of first through holes therein, one interdigital capacitor plate of the first interdigital capacitor is electrically connected to one interdigital capacitor plate of the second interdigital capacitor by one of the plurality of first through holes in the first insulating layer between layers where the first and second interdigital capacitors are located, and an other interdigital capacitor plate of the first interdigital capacitor is electrically connected to the other interdigital capacitor plate of the second interdigital capacitor by another one of the plurality of first through holes in the first insulating layer between the layers where the first and second interdigital capacitors are located.

3. The flexible display panel according to claim 1, wherein the at least one interdigital capacitor includes a plurality of interdigital capacitors,
wherein one of the plurality of interdigital capacitors is disposed in a same layer with a same material as one of at least two conductive layers of the plurality of conductive layers, and another one of the plurality of interdigital capacitors is disposed in a same layer with a same material as another one of the at least two conductive layers, and
wherein at least two of the plurality of interdigital capacitors are located in a same one of the at least one overlapping area.

4. The flexible display panel according to claim 1, wherein the at least one overlapping area includes a plurality of overlapping areas, and the at least one interdigital capacitor includes a plurality of interdigital capacitors,
wherein the plurality of interdigital capacitors are disposed in a same layer with a same material as one of the plurality of conductive layers, and
wherein the plurality of interdigital capacitors are located in different overlapping areas of the plurality of overlapping areas.

5. The flexible display panel according to claim 1, wherein a thickness of each strip-shaped protrusion is within a range from 1 μm to 3 μm, inclusive.

6. The flexible display panel according to claim 1, wherein a space between every two adjacent interdigital fingers in the interdigital capacitor is within a range from 3 μm to 5 μm, inclusive, and
wherein a dimension of each interdigital finger in a direction perpendicular to an extending direction of the interdigital finger is within a range from 3 μm to 5 μm, inclusive.

7. The flexible display panel according to claim 1, further comprising:
a third insulating layer covering the interdigital capacitor, a portion of the third insulating layer filling between every two adjacent interdigital fingers of the interdigital capacitor to form an insulating medium in the interdigital capacitor.

8. The flexible display panel according to claim 7, wherein the insulating medium includes a silicon-based organic material.

9. The flexible display panel according to claim 1, further comprising:
a base;
a plurality of driving circuits disposed above the base and located in the display area, each driving circuit including a driving thin film transistor and a storage capacitor, the driving thin film transistor including a gate, a source and a drain, and the storage capacitor including a first electrode and a second electrode; and
a plurality of light-emitting devices disposed on a side of the plurality of driving circuits facing away from the base and located in the display area, each light-emitting device including an anode, the light-emitting device being configured to emit light when driven by a corresponding one of the plurality of driving circuits,
the plurality of conductive layers including at least two of an anode layer where the anode is located, a source-drain layer where the source and the drain are located, a gate layer where the gate is located, a first electrode layer where the first electrode is located, and a second electrode layer where the second electrode is located.

10. The flexible display panel according to claim 9, wherein the first electrode layer and the gate layer are in a same layer, and the second electrode layer is disposed between the gate layer and the source-drain layer,
wherein the flexible display panel further comprises:
a fourth insulating layer disposed between the gate layer and the second electrode layer; and
a fifth insulating layer disposed between the second electrode layer and a source-drain layer, the fifth insulating layer being provided with a second through hole therein, and the second electrode in the second electrode layer being electrically connected to the drain in the source-drain layer by the second through hole in the fifth insulating layer.

11. The flexible display panel according to claim 9, wherein the first electrode layer is in a same layer as one of: the gate layer, the source-drain layer, and the anode layer, and
wherein the second electrode layer is in a same layer as another one of the gate layer, the source-drain layer, and the anode layer.

12. The flexible display panel according to claim 9, further comprising an auxiliary electrode layer disposed between the source-drain layer and the anode layer, the auxiliary electrode layer being electrically connected to the anode layer, and to the drain in the source-drain layer,
the plurality of conductive layers further including the auxiliary electrode layer.

13. The flexible display panel according to claim 9, wherein the light-emitting device is a top-emitting light-emitting device, and the anode of the light-emitting device is capable of reflecting light.

14. A display apparatus, comprising:
the flexible display panel according to claim 1; and
a first voltage terminal and a second voltage terminal,
wherein each interdigital capacitor in the flexible display panel includes two interdigital capacitor plates electrically connected to the first voltage terminal and the second voltage terminal, respectively.

15. The display apparatus according to claim 14, further comprising a detection circuit electrically connected to the at least one interdigital capacitor, the detection circuit being configured to determine a bending state of the flexible display panel according to a change value of a capacitance of the interdigital capacitor.

16. The flexible display panel according to claim 1, wherein the bending area is located in a middle of the flexible display panel.

17. The flexible display panel according to claim 1, wherein the extending direction of the bending sensing portion is perpendicular to or substantially perpendicular to the extending direction of the bending axis of the bending area.

* * * * *